United States Patent [19]
Marbot et al.

[11] Patent Number: 5,614,841
[45] Date of Patent: Mar. 25, 1997

[54] FREQUENCY MULTIPLIER USING XOR/NXOR GATES WHICH HAVE EQUAL PROPAGATION DELAYS

[75] Inventors: Roland Marbot, Versailles; Jean-Claude Le Bihan, Montrouge; Andrew Cofler, Paris; Reza Nezamzadeh-Moosavi, Bois d'Arcy, all of France

[73] Assignee: Bull S.A., Puteaux, France

[21] Appl. No.: 362,892

[22] Filed: Dec. 23, 1994

[30] Foreign Application Priority Data

Dec. 24, 1993 [FR] France ................................. 93 15631

[51] Int. Cl.⁶ ......................................................... H03K 19/21
[52] U.S. Cl. ............................... 326/52; 326/54; 326/55; 326/17; 327/116
[58] Field of Search ................................. 326/52, 54, 55, 326/17, 121; 327/116

[56] References Cited

U.S. PATENT DOCUMENTS

| | | | |
|---|---|---|---|
| 3,252,011 | 5/1966 | Zuk | 326/55 |
| 3,993,957 | 11/1976 | Davenport | 327/116 |
| 4,367,420 | 1/1983 | Foss et al. | 326/98 |
| 4,507,574 | 3/1985 | Seki et al. | 326/120 |
| 4,716,308 | 12/1987 | Matsuo et al. | 326/121 |
| 5,120,989 | 6/1992 | Johnson et al. | 327/116 |
| 5,448,181 | 9/1995 | Chiang | 326/83 |

FOREIGN PATENT DOCUMENTS

| | | | |
|---|---|---|---|
| 0265047 | 4/1988 | European Pat. Off. . | |
| 0441684 | 8/1991 | European Pat. Off. . | |
| 59-92624 | 5/1984 | Japan | 326/55 |
| 2-203621 | 8/1990 | Japan | 326/55 |
| 9317500 | 9/1993 | WIPO . | |

OTHER PUBLICATIONS

IBM Technical Disclosure Bulletin, vol. 32, No. 7 Dec. 1989, pp. 464–467, "Fast Parity Tree" entire document.
Proceedings of 32nd Midwest Symposium on Circuits and Systems, Aug. 14–16, 1989, Chancellor Hotel and Conven—et al: "On CMOS Exclusive OR Design", FIG. 1A.
IEEE Transactions on Computers, vol. 42, No. 2, Feb. 1993, New York, US, pp. 179–189, Niraj K. Jha: "Fault Detection in CVS Parity Trees with Application of Strongly Self--Checking Parity and Two-Rail Checkers", FIG. 4.
IBM Technical Disclosure Bulletin, vol. 26, No. 3A, Aug. 1983, pp. 990–991; I. Hernandez, Jr.: "Frequency Multiplier Using Delay Circuit" entire document.
Streetman, Ben G.; "Solid State Electronic Devices, 2nd Edition"; ©1980 by Prentice-Hall; p. 443.
Weste et al.; "Principles of CMOS VLSI Design, A Systems Perspective"; ©1985 by AT&T Bell Laboratories, Inc. & Kamran Eahraghian; pp. 18183 & 196–201.
IBM Technical Disclosure Bulletin; published anonymously; vol. 30, No. 4; Sep. 1987; pp. 1480–1481.

*Primary Examiner*—Edward P. Westin
*Assistant Examiner*—Benjamin D. Driscoll
*Attorney, Agent, or Firm*—Kerkam, Stowell, Kondracki & Clarke, P.C.; Edward J. Kondracki

[57] ABSTRACT

The gates (11) of the exclusive OR type having two inputs (A, B) are disposed in tree structure in successive layers of an integrated circuit beginning with an input layer which receives the input signals of the tree. The output of each gate is connected to an input of a gate in the adjacent layer. Each gate includes two cells (11a, 11b) that switch substantially simultaneously in response to two respective complementary signals (A, NA; B, NB) from one of the two inputs and that supply respective output signals that are representative of the complementary functions (XOR, NXOR) of the exclusive OR type. This makes it possible to obtain propagation times that are perfectly equal whatever the active input of the tree or the edge to be propagation times that are perfectly equal whatever the active input of the tree or the edge to be propagated may be.

18 Claims, 5 Drawing Sheets

| A,B | 0,0 | 0,1 | 1,0 | 1,1 |
|---|---|---|---|---|
| K' | 0v | −RI | −RI | −2RI |
| L' | −2RI | −RI | −RI | 0v |
| K | −RI | 0v | −2RI | −RI |
| L | −RI | −2RI | 0v | −RI |
| XOR | −RI      0 | 0v      1 | 0v      1 | −RI      0 |
| NXOR | 0v      1 | −RI      0 | −RI      0 | 0v      1 |

FIG.8

| A | B | NA.B | A.NB | A.B | NA.NB | XOR | NXOR |
|---|---|---|---|---|---|---|---|
| 0 | 0 | 1/2 | 1/2 | 0 | 1 | 0 | 1 |
| 0 | 1 | 1 | 0 | 1/2 | 1/2 | 1 | 0 |
| 1 | 0 | 0 | 1 | 1/2 | 1/2 | 1 | 0 |
| 1 | 1 | 1/2 | 1/2 | 1 | 0 | 0 | 1 |

FIG.9

| A | B | NA.B | A.NB | A.B | NA.NB | XOR | NXOR |
|---|---|---|---|---|---|---|---|
| 0 | 0 | 0 | 0 | 0 | 1 | 0 | 1 |
| 0 | 1 | 1 | 0 | 0 | 0 | 1 | 0 |
| 1 | 0 | 0 | 1 | 0 | 0 | 1 | 0 |
| 1 | 1 | 0 | 0 | 1 | 0 | 0 | 1 |

FREQUENCY MULTIPLIER USING XOR/NXOR GATES WHICH HAVE EQUAL PROPAGATION DELAYS

CROSS-REFERENCES TO RELATED APPLICATIONS

The invention of the subject application is related to application Ser. No. 08/649,335 which is a continuation of Ser. No. 08/362,891, now abandoned, entitled Exclusive OR/NOR Circuit Which Internally Generates Intermediate Logic Level Signs in the name of Mohamed Bedouani et al, filed of even date herewith and corresponding to French application No. 93 15632 filed Dec. 24, 1993, both of which are assigned to the assignee of the subject application. The subject matter of said application is hereby incorporated by reference.

FIELD OF THE INVENTION

More specifically, the invention is a tree of gates of the XOR type disposed in several layers, in which each gate in an integrated circuit arrangement of a layer has two inputs and one output connected to an input of a gate in the adjacent layer. The invention particularly applies to frequency multipliers which incorporate trees of this type. The invention also encompasses the integrated circuit which incorporates a tree of this type, either alone or in a combination such as that which constitutes a frequency multiplier. The integration can be achieved with MOS (Metal Oxide Silicon) technology, bipolar technology, as well as monocrystalline silicon, as in a III–V semiconductor such as gallium arsenide.

BACKGROUND OF THE INVENTION

IBM publication "Technical Disclosure Bulletin," Vol. 26, No. 3A, August 1983, pages 990–991, I. Hernandez, Jr.: "Frequency multiplier using delay circuits" describes a frequency multiplier formed by a chain of delay circuits whose outputs are connected to the respective inputs of a tree of XOR gates. The tree illustrated in this publication is made of gates which have two inputs and one output connected to an input of a gate in the next layer, and in which the other input is directly connected to the output of a respective delay circuit in the chain. Each gate thus constitutes a different layer of the tree. In other words, the tree has as many layers as the chain has delay circuits, and each layer has two branches, one of which returns to the preceding gates, and the other of which accesses a respective output of the chain. There is, therefore, an asymmetry in the time required for the propagation of signals in the two branches. This asymmetry increases proportionally as the output of the tree is approached. Therefore, in the output signal of the tree, the pulse repetition period of the same edge can vary greatly if frequency is increased. The frequency multiplier described in this publication is therefore not adapted for very high frequencies, for example greater than one gigabit per second.

European patent disclosure EP-A-0441684 describes a frequency multiplier in which the successive outputs of the chain of delay circuits are driven by a phase locked loop and are all applied to the respective inputs of the first layer of the tree of XOR gates. The subsequent layers have an integrated circuit arrangement of a, whereas the last layer has only one gate. This tree, then, assures a propagation which is roughly the same for each of the input signals and is suitable for very high frequencies.

However, at such high frequencies, the tree must guarantee equal propagation times from its respective inputs to the output, regardless of the edge to be propagated. When this is the case, the tree is said to be symmetrical. Symmetry implies that all the gates of the tree are arranged identically in the integrated circuit, that they produce equal propagation times regardless of the active input and the edge to be propagated, and that their loads are identical.

In attempting to satisfy all these requirements, a first problem arises due to the fact that an XOR-type gate may or may not be able to invert a signal that is applied to its first input, depending on the state of the second input, a state which remains stable during switching. Consequently, depending on the states of the inputs of the tree, a leading edge at the output can only be generated by leading edges in the tree, by a majority of trailing edges or by any intermediate configuration. The converse also applies to a trailing edge at the output of the tree.

Other problems arise in employing the technology of integrated circuits using complementary field effect transistors with insulated gates, which is currently called CMOS (Complementary Metal Oxide Silicon) technology. This technology offers the advantage of using gates based on an inventor circuit which simply includes two complementary NMOS (N type) and PMOS (p type) transistors connected in series between the two supply potentials Vdd and Vss. The input signal is applied to the gates of the two transistors and the output signal is supplied at the linkage point of the drains of the two transistors. The PMOS transistor assures the output switching of the leading edges, while the trailing edges are generated by the NMOS transistor. This asymmetry, which is inherent to this technology, makes it impossible to satisfy of the requirement for the symmetry of the tree. This requirement has particular repercussions for the equalization of the loads. This last requirement is partially satisfied by equalizing the wiring lengths between adjacent gates, but the problem essentially lies in the equalization of the internal loads of such gates.

Finally, assuming that these two problems have been resolved, it is still necessary for the direct and inverted inputs of the input gates of the tree to permutate simultaneously in opposite directions. This condition does not generally arise in CMOS technology, in which the only way to obtain the inverse of a signal is to add an inverter. However, due to the transit time of this inverter, the direct signal and its inverse do not switch at exactly the same moment.

On the other hand, bipolar transistor technologies make it possible to obtain better dynamic performances, especially higher throughputs. Bipolar transistors naturally lend themselves to symmetrical arrangements, particularly due to the utilization of differential ECL (Emitter-Coupled Logic) or CML (Common Mode Logic) layouts. However, the higher throughputs increase the requirements for the symmetry of the tree and necessitate specific layouts. In ECL logic, a standard XOR gate is made from two superposed differential stages which are connected in series (series gating) and which, respectively, receive the complementary signals of the two inputs. This layout has the disadvantage of having different propagation times for the two inputs, since the complementary signals which issue from the lower stage must transit the upper stage. Thus, in addition to the first problem mentioned above relative to the various states of the inputs of the tree, these gates pose the same problem as the transistors in series in the CMOS branches.

SUMMARY OF THE INVENTION

The present invention resolves these three problems in order to obtain a tree which provides propagation times that are perfectly equal whatever the active input of the tree or the edge to be propagated may be.

The subject of the invention is a tree of gates of the exclusive OR type with two inputs, in which the gates are disposed in successive layers of an integrated circuit beginning with an input layer which receives the input signals of the tree, and in which the output of each gate is connected to an input of a gate in the adjacent layer, characterized in that each gate includes two cells which switch substantially simultaneously in response to the two respective complementary signals from one of the two inputs and which supply respective output signals that are representative of the complementary functions of the exclusive OR type.

A corollary subject of the invention is a frequency multiplier which includes a chain of delay circuits whose outputs are applied to the respective inputs of a tree of gates of the exclusive OR type, characterized in that the tree is that defined previously.

It is understood that the integrated circuit which incorporates the preceding objects according to the invention is also a subject of the invention.

BRIEF DESCRIPTION OF THE DRAWINGS

The invention is further expalined in the description of the examples illustrated in the appended drawings, in which.

DESCRIPTION OF THE PREFERRED EMBODIMENTS

Figure 1:
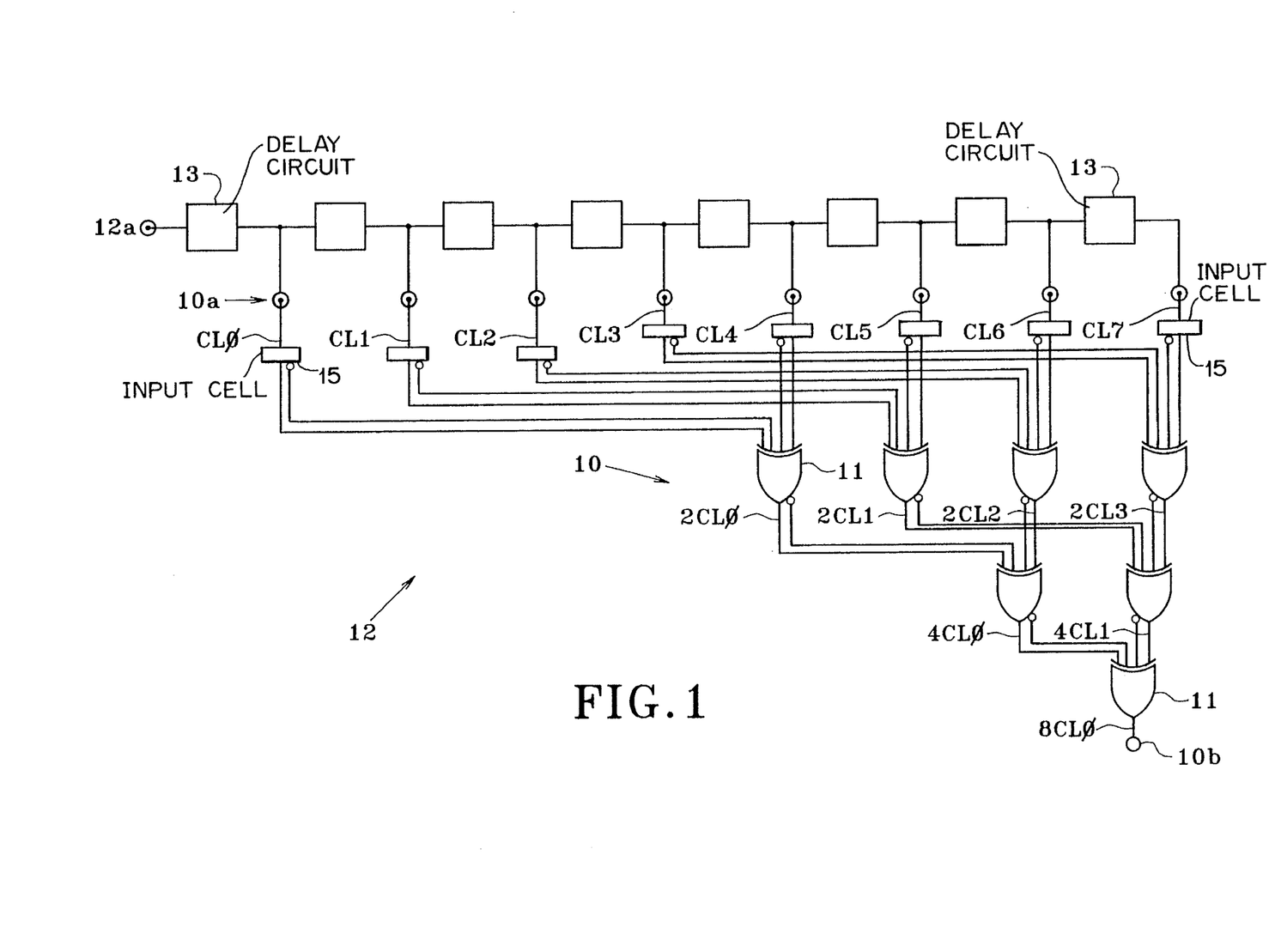
FIG. 1 schematically illustrates the structure of a frequency multiplier which incorporates a tree of XOR gates.

In FIG. 1, a tree 10 of gates 11 of the XOR type has input terminals 10a which receives eight input signals CL0–CL7 and one output terminal 10b which delivers an output signal 8CL0. The gates 11 are disposed in several layers of an integrated circuit, three in the example illustrated, and their respective outputs are connected to an input of a gate in the adjacent layer. The first layer, which constitutes the input layer, includes four gates whose eight inputs constitute the input terminals 10a and receive the eight input signals CL0–CL7 respectively, and whose four outputs deliver four respective signals 2CL0–2CL3 which comprises the input signals to the second layer of gates. The second layer includes two gates 11 which deliver two respective signals 4CL0 which comprises input signals to 4CL1, and the third layer, which constitutes the output layer, and includes only one gate 11 which delivers the output signal 8CL0. The tree 10 illustrated in FIG. 1 forms a frequency multiplier 12 with a chain of delay circuits 13. The frequency multiplier 12 has an input terminal 12a which receives an external signal, a clock signal CL for example, and the chain includes eight delay circuits 13, whose respective outputs supply the eight input signals CL0–CL7.

Figure 2:
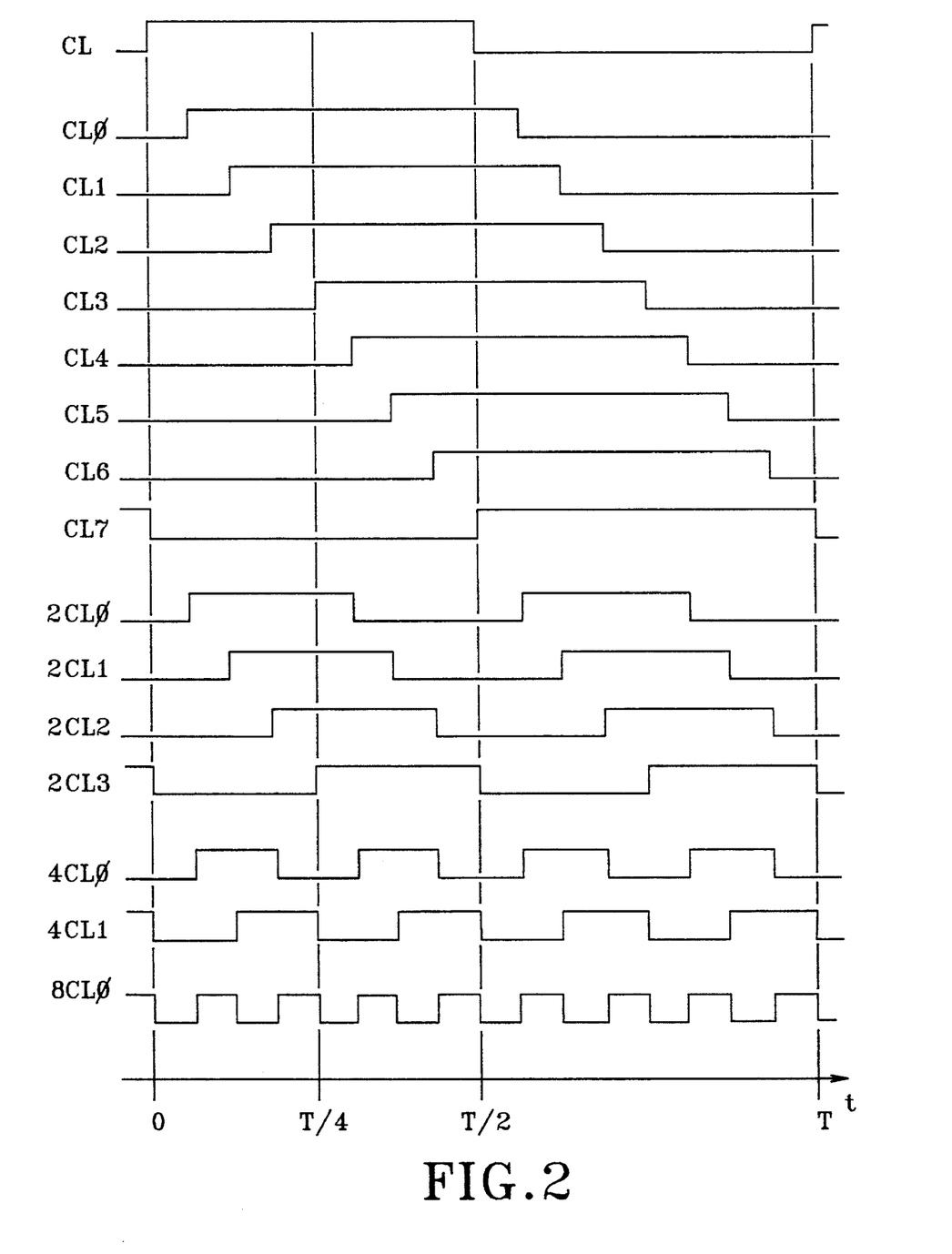
FIG. 2 is a diagram illustrating the functioning of the frequency multiplier shown in FIG. 1.

FIG. 2 is a diagram which represents the wave forms of all the signals indicated in FIG. 1, thus illustrating the functioning of the frequency multiplier 12. The eight delay circuits produce equal respective delays which share the time interval T of two predetermined recursive edges of the clock signal CL, the leading edges in the example illustrated. The clock signal CL is therefore successively offset from T/8 in order to supply the eight input signals CL0–CL7. The frequency of these signals is multiplied by two in each of the successive layers of the tree 10. In the example illustrated, the output signal 8CL0 has a frequency eight times higher than that of the clock signal CL.

Figure 3:
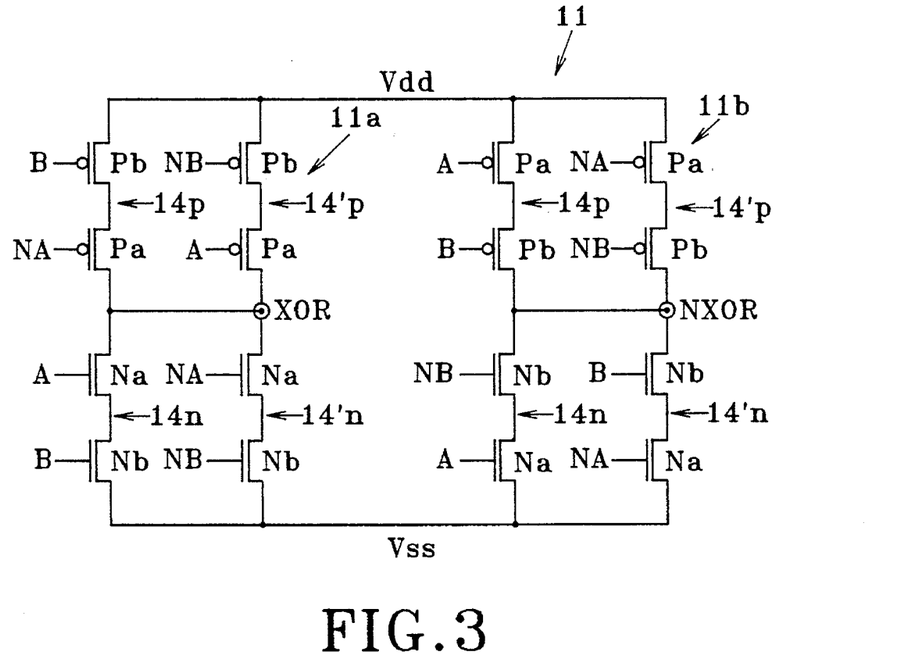
FIG. 3 schematically illustrates a first exemplary embodiment in CMOS technology of a gate of the tree shown in FIG. 1.

FIG. 3 illustrates a first exemplary embodiment in CMOS technology of a gate 11 according to the invention. Each gate 11 includes two complementary cells 11a and 11b which respectively supply the XOR, NXOR output signals that are representative of the exclusive OR-type complementary functions of the input signals. In the example illustrated in FIG. 3, the input signals are designated by A and B and their inverses are designated by NA and NB. Thus A, NA, and B, NB are four complementary input signals 60 the two inputs of the two cells 11a and 11b. Each of the cells illustrated 11a and 11b is made from two pairs 14, 14' of complementary branches 14n, 14p and 14'n, 14'p linked at a common point, which constitute the output of the cell and deliver the respective XOR and NXOR signals. Each branch includes two transistors which have their drain-source current paths connected in series between a supply potential and the common point. The two branches 14p and 14'p are linked to the high supply potential Vdd and include two transistors Pa, Pb of the PMOS type, while the other two branches 14n and 14'n are linked to the low supply potential Vss and include two transistors Na, Nb of the NMOS type. In the pair of complementary branches 14p and 14n, the pair of complementary transistors Pa and Na receive the input A in their gates, while in the pair of complementary branches 14'p and 14'n the pair of complementary transistors Pa and Na receive the complementary signal NA of the input A in their gates. The two pairs of complementary transistors Pa, Na are each connected in series with the two respective complementary transistors Pb, Nb which receive the complementary signals B, NB of the other input in their gates. Thus the four branches of each cell are totally symmetrical. At each moment, two complementary branches are active in one cell. Lets suppose for example that B=0, NB=1 , and that A is the signal that switches. In the pair of branches 14 of the XOR cell 11b, the transistor Pb and the transistor Nb are active. The NXOR output therefore switches as a result of the switching of A in the branch 14p or in the branch 14n depending on whether the edge of the input A is trailing or leading. The other pair of branches 14' is inactive in this case. Symmetrically, in the XOR cell 11a, it is the complementary branches 14p and 14'n that are active so as to respond to a leading edge or a trailing edge of NA, respectively. Thus it can be seen that the two cells 11a, 11b switch roughly simultaneously in response to the two respective complementary signals from one of the two inputs, the gate 11b in response to A and the gate 11a in response to NA, both in a very symmetrical manner. The same is true for the other input B. Briefly, each gate 11 includes two cells 11a, 11b which switch roughly simultaneously in response to the two respective complementary signals A, NA and B, NB from one of the two inputs and supplies the respective output signals which are representative of the complementary XOR and NXOR functions of the exclusive OR type.

However, each branch is constituted by two transistors in series. In order to make the times for the propagation of one or the other input to the output identical, a known solution consists of enlarging the transistor linked to Vdd or to Vss relative to the transistor linked to the output. For example, in a technology with 0.5 microns, the ratio of the sizes of the two transistors in the branch would be 1.25. This ratio would assure roughly identical propagation times. However, this solution can prove difficult to achieve with certain technological processes or under certain conditions. For example, it may not be possible to find a relationship between the two transistors in the same branch in which the propagation times would be comparable.

Figure 4:
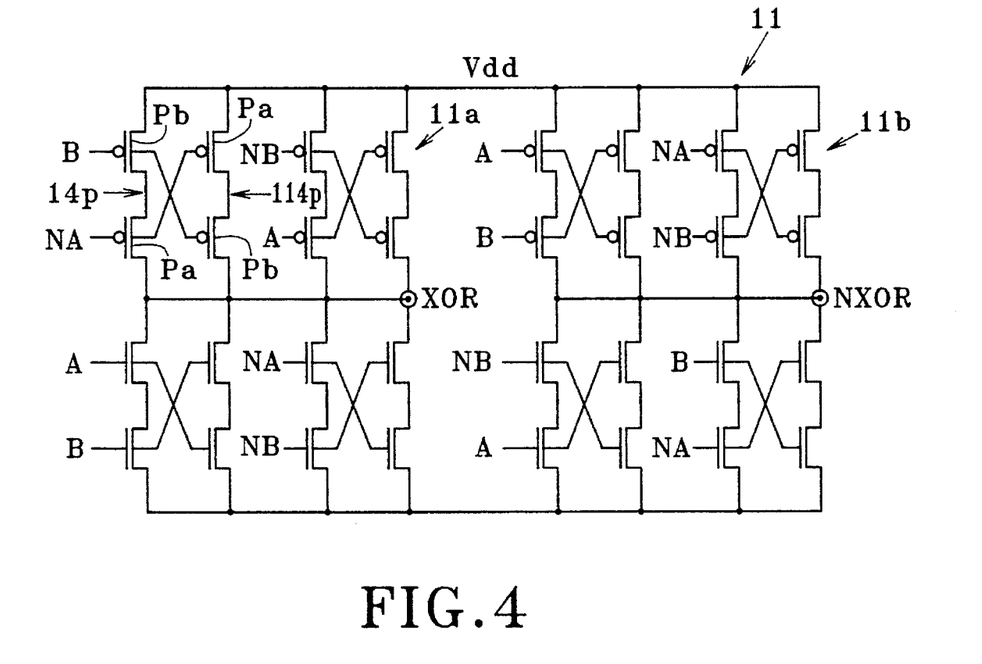
FIG. 4 schematically illustrates a second exemplary embodiment in CMOS technology of a gate of the tree shown in FIG. 1.

FIG. 4 illustrates a solution which assures perfect symmetry of the propagation times. This solution consists of splitting each of the branches 14p, 14n, 1'p, and 14'n into two twin branches 114p, 114n, 114'p and 114'n, in which the inputs are crossed. For example, in the XOR cell 11a illustrated in FIG. 3, the branch 14p which receives the inputs B and NA is, in the corresponding cell in FIG. 4, is split into twin branches 14p, 14'p, in which the inputs are crossed: the branch 14p remains unchanged while in the branch 114p the input NA is applied to the transistor near the potential Vdd, and vice versa for the input B. Thus, the input impedance experienced by the input NA is that formed by the two transistors in series in the branch 14p and, in parallel, that of the transistor Pa near Vdd in the branch 114p. Likewise, the input impedance experienced by the input B is that formed by the transistor Pb in the branch 14p and, in parallel, that of the two transistors in series in the branch 114p. More generally, due to the crossing of the inputs in the twin branches, each of the inputs A, NA, B, and NB experiences roughly the same input impedance, which is constituted by the parallel connection of the two transistors in series in one branch and by the transistor near the supply potential in the twin branch. The balancing of the input impedances assures the same propagation times for the input signals A, NA, B, and NB in each of the cells 11a and 11b of a gate 11 and maintains their symmetry.

It is now possible to analyze the characteristics of the tree 10 of FIG. 1 constituted by layers of gates 11 as illustrated in FIGS. 3 and 4. Let it be assumed, for the sake of the clarity of the explanation, that the output 10b of the tree 10 switches as a result of a chain which only passes through the inputs A or NA of the gates in the different layers. Taking into account the total symmetry of the gates 11 between the inputs A and B, this situation has no specific characteristics with respect to the other inputs B and NB. Let it also be assumed that the output 10b of the tree 10 switches from a leading edge, knowing that the same reasoning would apply to a trailing edge. We know that this leading edge at the output is generated by a transistor P in the last layer of gates 11 of the tree. We do not know whether this transistor P is that controlled by the signal NA, for that depends on the state of the signal B. But the total symmetry between A or NA and the output means that this uncertainty has no effect on the result. What we know with certainty is that the signal A or NA which caused the output 10b to switch toward the high level was a signal with a trailing edge. The respective complementary signal NA or A was therefore a signal with a leading edge, which had no effect on the output switching since it was applied to the inactive branches of the cells. The active signal with a trailing edge was therefore generated in the next-to-last layer of gates 11 by a transistor N. The same reasoning as the preceding applies to the next-to-last layer of the tree 10. Briefly, this active transistor N (Na or Nb) switched as a result of a leading edge. Continuing with this reasoning for the inputs 10a of the tree 10, if there is an even number of layers in the tree, the switching path passes through as many transistors N as transistors P. Under these conditions, the propagation time in the tree 10 is the same for each edge.

The symmetry requirement now applies to the input 10a of the tree 10, in which the complimentary inputs must switch simultaneously in the opposite direction. This condition is not usual in CMOS technologies in which the only way to obtain the inverse of a signal is to add an inverter. However, due to the insertion of this inverter, the inverse signal is offset from the direct signal in the period of the transit time of the inverter. Added to this asymmetry is the slightest asymmetry between the transistor P and the transistor N of this inverter.

Figure 5:
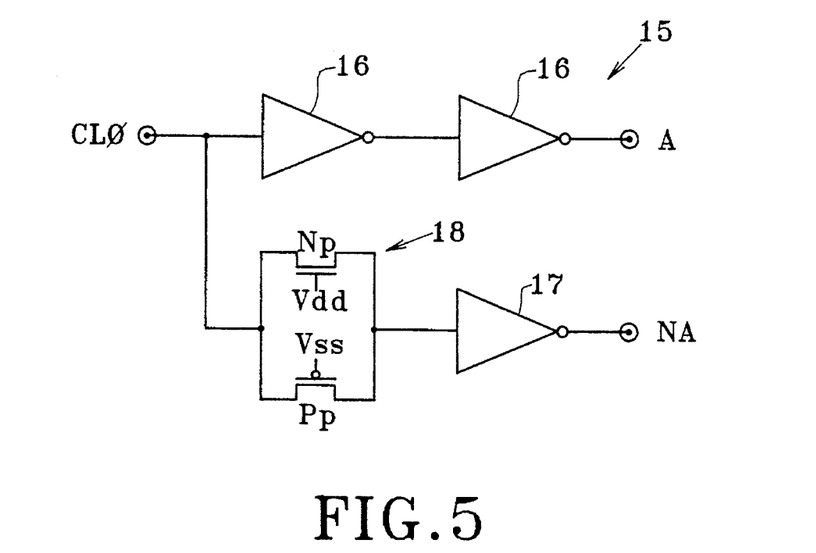
FIG. 5 schematically illustrates an input cell which generates the complementary signals of an input of a gate, as shown in FIG. 3 or 4, in the input layer of the tree shown in FIG. 1.

In order to resolve this difficulty, the complementary signals A, NA and B, NB applied to each of the gates 11 in the first layer of the tree 10 are issued by two respective input signals of the eight input signals CL0–CL7 in FIG. 1 and are generated by two respective input cells 15. FIG. 5 illustrates an exemplary embodiment of the input cell 15 relative to the input signal CL0 issued by the corresponding input terminal 10a of the tree 10 and applied to the input of the input cell 15. In the cell 15 illustrated, the input CL0 passes through a direct channel which delivers the input A and through an inverter channel which delivers the inverse input NA. The direct channel includes two CMOS inverters 16 in series, while the inverse channel includes a CMOS inverter 17 in series with a circuit 18 formed by two complementary types of pass-transistors Np and Pp which have their drain-to-source current paths in parallel and their gates connected to the respective supply potentials Vdd and Vss. The inverter channel inverts the input signal CL0 by means of the inverter 17 and delays them by means of the circuit 18 of pass-transistors. The inverter 17 and the circuit 18 are sized so as to generate propagation times that are as equal as possible to the respective propagation times in the two inverters 16 of the direct channel. Naturally, the inverter 17 and the circuit 18 do not function in the same way, therefore this compensation can only be approximate. But the input cell 15 can only to be transited once, although the gates 11 are transited as many times as there are layers in the tree 10. The difference in propagation time which may then appear, and which one will seek to minimize, will therefore not be cumulative.

In practice, the gates illustrated in FIGS. 3 and 4 for equalizing the propagation times in a tree 10 with four layers have been able to achieve a precision of several tens of picoseconds, in spite of variations in manufacturing, temperature and supply voltage.

Several variants to the tree 10 which has just been described may be contributed by one skilled in the art. For example, it is apparent that the input cell 15 can be limited to one channel which includes an inverter 16 that supplies the input NA and one channel which includes the circuit 18 that supplies the input A.

Figure 6:
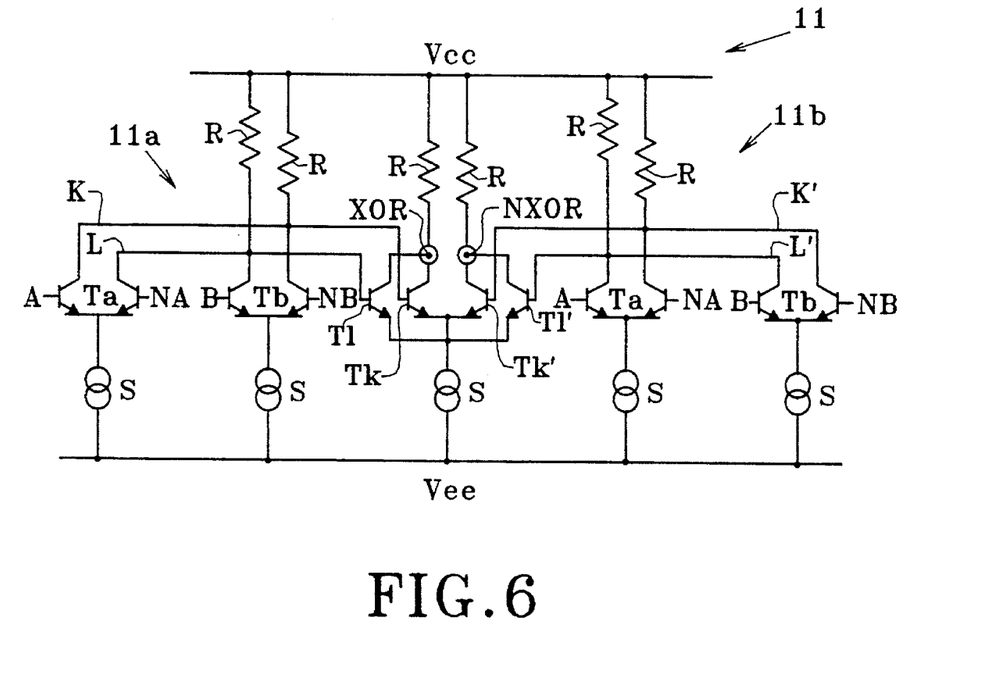
FIG. 6 schematically illustrates an exemplary embodiment in bipolar technology of a gate of the tree shown in FIG. 1.

FIG. 6 illustrates a mode of embodiment using bipolar transistors which constitute symmetrical differential arrangements for the formation of the cells 11a and 11b of each gate of the tree 10. The example illustrated shows a layout in CML logic that is totally symmetrical. A layout in CML logic can be obtained by the simple addition of voltage shift stages formed by emitter follower circuits. The gate 11 in FIG. 6 includes the two cells 11a and 11b, each of which is made from a differential arrangement of two bipolar transistors Ta which receive the complementary signals from the input A, and from a differential arrangement of two bipolar transistors Tb which receive the complementary signals from the other input B. The two arrangements are fed by respective current sources S connected to the low supply potential Vee. In the cell 11a illustrated, the two transistors Ta and Tb which receive the respective inputs A and B have their collectors linked to the high supply potential Vcc by means of a load resistor R. The same is true for the transistors Ta and Tb which receive the respective inputs NA and NB. The two potentials K and L supplied by the resistors R are representative of the logic products A.NB and NA.B and are added logically in a gate of the OR type formed by two transistors Tk and Tl which have their collector-emitter paths in parallel and are connected in series between a load resistor R and a current source S. The common point of the two collectors of the transistors Tk and Tl constitutes the output terminal of the cell 11a and supplies the XOR output signal. In the cell 11b, the collectors of the transistors Ta and Tb are interconnected so as to obtain the potentials K' and L' that are representative of the logic products A.B and NA.NB, which are added logically in an OR-type gate similar to that of the other cell with which it has the current source S in common. The common point of the collectors of the transistors Tk' and Tl' constitutes the output terminal of the cell 11b which supplies the NXOR signal.

Figure 7:
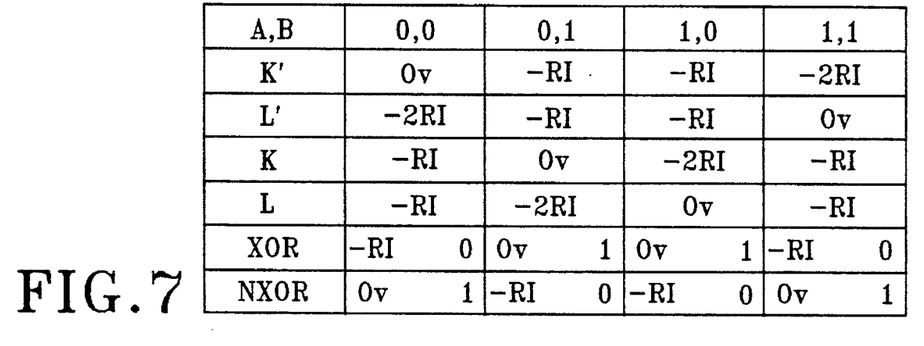
FIG. 7 is a table indicating the potential levels obtained in the gate shown in FIG. 6.
Figure 8:
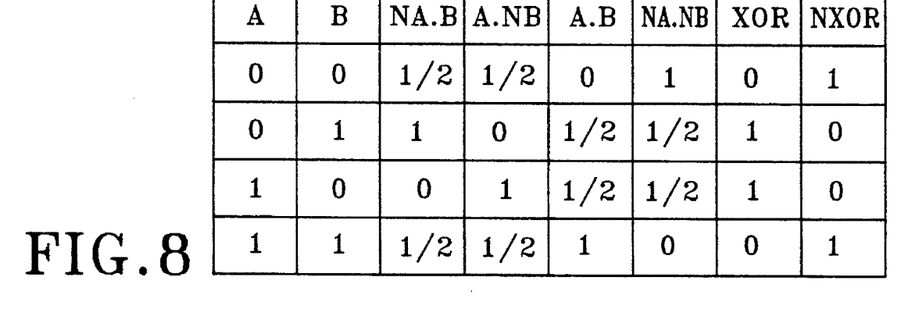
FIG. 8 is a truth table for the gate with three logic levels shown in FIG. 6.
Figure 9:
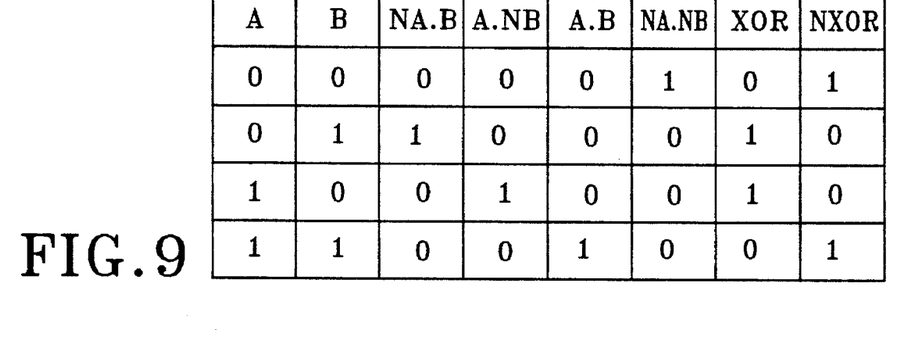
FIG. 9 is a truth table for the gate shown in FIG. 6, which has been corrected so as to have two logic levels which correspond to the XOR and NXOR functions.

FIG. 7 indicates the potential levels obtained in one mode of embodiment of the gate 11 shown in FIG. 6, in which Vcc=0 volts (0 v) and Vee=–5 volts, R designates the value of the load resistors R, and I designates the intensity of the current that flows through each of the sources S. Principally, it will be observed that the potentials which are representative of the products K, L, K' and L' can have the three values 0 m –RI and –2RI and therefore constitute a ternary logic. In the last two rows relative to the XOR and NXOR outputs, 0 and 1 designate the output logic levels. What results is the truth table shown in FIG. 8, in which the intermediate state –RI is designated by ½. By making sure that the intermediate state corresponds to one of the binary states, in this case the state representing the off state of the transistors of the OR-type gates, one obtains the truth table in FIG. 9, which is theoretically representative of the XOR and NXOR gates and the logic levels indicated in the table in FIG. 7. In the example illustrated, as a rule, the intermediate state is considered to correspond to one of the binary states when the deviation between the two is contained within the tolerable noise margin. This was achieved in the example under consideration by sizing the bipolar transistors accordingly. A more detailed description of this exemplary embodiment will be found in the aforenoted U.S. application Ser. No. 08/649,335 (Bull Ref. U.S. 3449/HD) and French patent application, 93 15632. The tables in FIGS. 7, 8 and 9 are considered to be an integral part of the description. The gate 11 thus supplies, in principle, the same propagation time in the two cells 11a and 11b, whatever the input that switches, whatever the edge at the output and whatever the cell may be. The tree 10 will therefore be perfectly symmetrical if the wiring lengths between the gates 11 are carefully equalized.

Briefly, if the tree is made either entirely or in part by using a bipolar transistor technology such as that known by the acronym BiCMOS, then one of the cells includes two symmetrical differential arrangements which are interconnected so as to produce potentials that are representative of the logic products A.B and NA.NB and one OR-type gate for forming the logical sum of the two products, whereas the other cell includes two symmetrical differential arrangements which are interconnected so as to produce potentials that are representative of the logic products A.NB and B.NA and one OR-type gate for forming the logical sum of the two products, the two OR-type gates having a common current source. The differential arrangements form gates of the AND type, NAND gates in this case, whereas the OR-type gates illustrated are NOR gates.

Another subject of the invention is a frequency multiplier which includes a chain of delay circuits whose outputs are applied to the respective inputs of a tree of XOR-type gates according to the invention. The chain may simply be that described in the publication cited in the introduction, or that described in the patent reference also cited in the introduction, or yet another type. Generally, one skilled in the art knows how to form any multiplication factor, even or odd, with a tree of gates of the exclusive OR type with an even or odd number of layers, in which the two inputs of each of the gates can be variously connected in order to obtain the desired multiplication factor. In other words, in order to construct a minimal tree using CMOS technology that has the desired multiplication factor when the number of layers is theoretically odd, it is known to add a layer, thereby interconnecting the gates of each layer so as to obtain the desired multiplication factor. However, it is known that the only defect caused by an odd number of layers is the presence of the last odd layer, since the preceding even number of layers guarantees perfect symmetry. Hence is the total defect of a tree with an odd number of layers is less than the allowed tolerances, the odd number may be retained.

Although the invention shown applies to monocrystalline silicon, it can also apply to a III-V semiconductor such as gallium arsenide. For example, the bipolar transistor structure described in reference to FIG. 6 can be directly transcribed into SCFL (Source-Coupled FET Logic) logic MESFETs (Metal Semiconductor Field Effect Transistors), as described in the aforenoted U.S. application Ser. No. 08/649, 335 (Bull U.S. 3449/HD).

We claim:

1. A frequency multiplier which includes a chain of delay circuits having outputs applied to respective inputs of a tree of XOR-type gates, wherein the tree (10) comprises gates (11) of the exclusive OR type with two inputs (A, B), in which the gates are disposed in successive layers of an integrated circuit beginning with an input layer which receives input signals applied to the tree, and in which an output of each gate is connected to an input of a gate in the adjacent layer, characterized in that each gate includes two cells (11a, 11b) adapted to switch substantially simultaneously in response to two respective symmetrical complementary signals (A, NA; B, NB) from one of the two inputs, said cells supplying respective output signals representative of complementary functions (XOR, NXOR) of the exclusive OR type.

2. A frequency multiplier as set forth in claim 1 characterized in that the gates are made using CMOS technology, each cell includes a first pair of complementary transistors (Na, Pa) which receives one (A) of the inputs and a second pair of complementary transistors (Na, Pa) which receives a complementary signal (NA) of said input, the two pairs of transistors each being connected in series with two respective complementary transistors (Nb, Pb) which receive the symmetrical complementary signals of the other input (B, NB), the two pairs and their complementary transistors forming four branches (14n, 14p, 14'n, 14'p) linked at a common point which constitutes the output of the cell.

3. A frequency multiplier as set forth in claim 2 characterized in that each of the branches, the transistor linked to the output of the cell has a size smaller than the other transistor in a proportion that is predetermined in such a way that they have roughly equal propagation times.

4. A frequency multiplier as set forth in claim 3 characterized in that each of the branches (14p) is split into two twin branches (14p, 114p) in which the inputs are crossed.

5. A frequency multiplier as set forth in claim 2 characterized in that the number of layers of the tree is even.

6. A frequency multiplier as set forth in claim 2 characterized in that the input signals (CL0–CL7) of the tree are applied to the respective inputs of the gates in the input layer by means of input cells (15) which generate the symmetrical complementary signals of each of the input signals.

7. A frequency multiplier as set forth in claim 6 characterized in that each input cell includes one channel which includes an inverter (16) and a second channel which includes a circuit (18) of complementary pass-transistors (Np, Pp) which have their drain-source paths connected in parallel and their gates connected to two supply potentials (Vdd, Vss).

8. A frequency multiplier as set forth in claim 1 characterized in that the cells comprise bipolar technology.

9. A frequency multiplier as set forth in claim 1 characterized in that the cells are integrated in a III–V semiconductor such as gallium arsenide, in SCFL logic.

10. A logic gate tree (10) comprising a plurality of gates (11) of exclusive OR type each having means for receiving complementary forms of two input signals (A, NA; B, NB) and including two cells (11a, 11b) switching substantially simultaneously in response to said complementary forms of one of said input signals for supplying respective complementary output signals representative of complementary logical functions (XOR, NXOR) of said exclusive OR type, said gates being arranged in layers from an input layer to an output layer to form the gate tree and said complementary output signals of each gate of said layers, except for said output layer, being connected to form said complementary forms of one of said input signals of one of said gates in an adjacent layer.

11. The tree according to claim 10, characterized in that the gates are made using CMOS technology, each cell includes a first pair of complementary transistors (Na, Pa) which receives one (A) of the input signals and a second pair of complementary transistors (Na, Pa) which receives a complementary signal (NA) of said input signal, the two pairs of transistors each being connected in series with two respective complementary transistors (Nb, Pb) which receive the complementary signals of the other input signal (B, NB), the two pairs and their complementary transistors forming four branches (14n, 14p, 14'n, 14'p) linked at a common point which constitutes the output of the cell.

12. The tree according claim 11, characterized in that the input signals of the tree are applied to the respective inputs of the gates in the input layer by means of input cells (15) which generate the complementary signals of each of the input signals.

13. The tree according to claim 12, characterized in that each input cell includes one channel which includes an inverter (16) and a second channel which includes a circuit (18) of complementary pass-transistors (Np, Pp) which have their drain-source paths connected in parallel and their gates connected to two supply potentials (Vdd, Vss).

14. The tree according to claim 11, characterized in that each of the branches (14p) is split into two twin branches (14p, 114p) in which the inputs are crossed.

15. The tree according to claim 11, characterized in that the number of layers in the tree is even.

16. The tree according to claim 11, characterized in that in each of the branches, the transistor linked to the output of the cell has a size smaller than the other transistor in a proportion that is predetermined in such a way that they have roughly equal propagation times.

17. The tree according claim 10, characterized in that the cells are integrated in a III–V semiconductor such as gallium arsenide, in SCFL logic.

18. The tree according to claim 10, characterized in that the cells comprise bipolar technology.

* * * * *